(12) United States Patent
Jung et al.

(10) Patent No.: US 6,597,570 B1
(45) Date of Patent: Jul. 22, 2003

(54) DEVICE FOR DISSIPATING HEAT FROM AN ELECTRONIC COMPONENT SITUATED IN A HOUSING

(75) Inventors: Robert Jung, Kümmersbruck (DE); Rainer Kreutzer, Weiden (DE); Erich Zerbian, Fensterbach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/009,015

(22) PCT Filed: May 17, 2000

(86) PCT No.: PCT/DE00/01569

§ 371 (c)(1),
(2), (4) Date: Nov. 30, 2001

(87) PCT Pub. No.: WO00/74456

PCT Pub. Date: Dec. 7, 2000

(65) Prior Publication Data (65)

(30) Foreign Application Priority Data

May 31, 1999 (DE) .......................................... 199 24 957

(51) Int. Cl.$^7$ ................................................. H05K 7/20
(52) U.S. Cl. ........................ 361/695; 361/707; 361/710; 361/717; 165/80.2; 165/185; 454/184
(58) Field of Search ...................... 62/259.2; 165/80.2, 165/80.3, 185; 174/16.3; 361/688–690, 694–695, 704–710, 715, 717, 718, 722; 257/706–707, 712–713, 718–719; 454/184

(56) References Cited

U.S. PATENT DOCUMENTS

| 4,459,638 A | | 7/1984 | Brehm et al. | |
|---|---|---|---|---|
| 4,525,769 A | | 6/1985 | Lehmann | |
| 5,235,491 A | | 8/1993 | Weiss | |
| 5,461,540 A | * | 10/1995 | Lee | 361/707 |
| 5,526,232 A | * | 6/1996 | Kolberg et al. | 361/715 |
| 5,936,839 A | * | 8/1999 | Saito | 361/707 |
| 6,151,215 A | * | 11/2000 | Hoffman | 361/704 |
| 6,418,021 B1 | * | 7/2002 | Itabashi et al. | 361/704 |

FOREIGN PATENT DOCUMENTS

| DE | 27 22 142 | 11/1978 |
|---|---|---|
| DE | 27 46 221 C2 | 4/1979 |
| DE | 37 10 198 A1 | 10/1988 |
| DE | 91 06 514.3 | 9/1991 |
| GB | 2 178 243 A | 2/1987 |

\* cited by examiner

Primary Examiner—Gregory Thompson
(74) Attorney, Agent, or Firm—Harness, Dickey & Pierce, P.L.C.

(57) ABSTRACT

To dissipate heat from a lossy electronic component which is fixed to the inner side of a wall of a housing, several of the outer and/or inner sides of the housing are placed into contact with a cooling element. In this way, a large part or all of the housing surface can be used to dissipate lost heat to the surroundings.

11 Claims, 1 Drawing Sheet

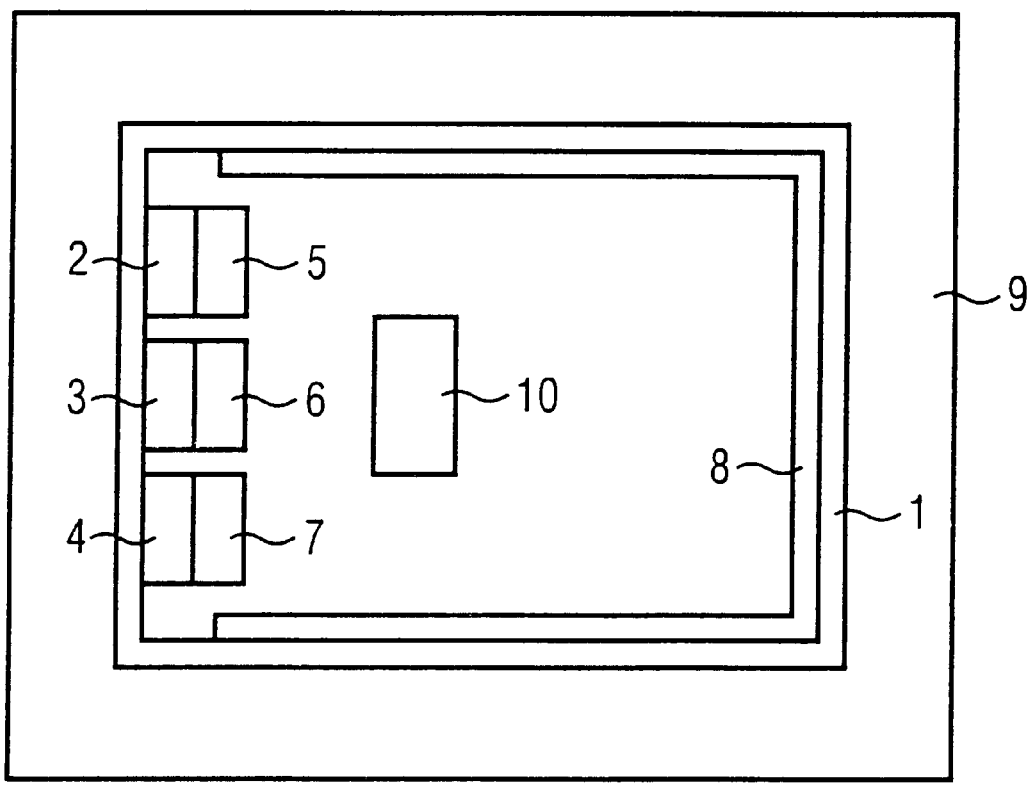

DEVICE FOR DISSIPATING HEAT FROM AN ELECTRONIC COMPONENT SITUATED IN A HOUSING

This application is the national phase under 35 U.S.C. §371 of PCT International Application No. PCT/DE00/01569 which has an International filing date of May 17, 2000, which designated the United States of America, the entire contents of which are hereby incorporated by reference.

FIELD OF THE INVENTION

The invention generally relates to a device for dissipating heat. More preferably, it relates to a device for dissipating heat from a lossy electronic component fixed to an inside wall of a housing. Even more preferably, it relates to one in which several of the outside and/or inside walls of the housing are placed into contact with a cooling element.

BACKGROUND OF THE INVENTION

Various cooling methods are known for dissipating heat from lossy electronic components. The method used most frequently is cooling by convection, which may be assisted by a fan.

Furthermore, it is already known for the dissipation of lost heat from power components to fix them to an inside wall of a housing and to dissipate the lost heat via this one housing wall. The housing wall is in this case connected on its outer side to a cooling element, via which the heat is dissipated to the surroundings.

DE 27 22 142 A1 discloses a metallic housing wall for a housing receiving electronic devices. The housing wall of this known housing is fitted with semiconductor devices placed on the outside. Furthermore, several heating elements are placed into contact with the outer and inner sides of the housing wall.

SUMMARY OF THE INVENTION

It is an object of the invention to specify a device for dissipating heat from a lossy electronic component fixed to an inside wall of a housing, in which the heat dissipation is improved.

This object is achieved, for example, by a device having the features specified in claim 1. Advantageous configurations and developments of the invention emerge from the dependent claims.

The advantages of the invention are, for example, that the lost heat produced in the electronic component is passed on via a large part of the housing surface or even all of the housing surface to cooling elements and is dissipated by these to the surroundings.

The use of a fan, which may be temperature-controlled and is provided in the interior space of the housing, has the effect of improving the distribution of the heat in the interior of the housing and, as a result, achieves improved heat dissipation via the cooling elements provided.

BRIEF DESCRIPTION OF THE DRAWINGS

Further advantageous properties of the invention emerge from the explanation of an exemplary embodiment with reference to the figure.

The figure shows a housing 1, which for example, has altogether six housing walls, four of which can be seen from the figure. These are a left-hand side wall, a right-hand side wall, an upper wall and a lower wall.

DETAILED DESCRIPTION OF THE PREFERRED EMBODIMENTS

Fixed to the inner side of the left-hand side wall of the housing 1 shown in the figure, are lossy electronic components 2, 3, 4, which are, for example, power semiconductors. The housing 1 is surrounded in a positively engaging manner on several of its outer sides, preferably—as represented in the figure—on four of its outer sides, by one or more cooling elements 9.

The lost heat produced in the power semiconductors 2, 3, 4 is directed into the housing walls including an aluminum diecasting and is passed on by these to the cooling element or elements 9, which have been placed into contact with the outer sides of the housing walls.

This heat dissipation over a large area using all of the housing surface achieves both faster heat dissipation and dissipation of a greater amount of heat.

A further improvement in the heat dissipation is achieved by the power semiconductors 2, 3, 4 being connected in each case on their side remote from the inner side of the housing to a further cooling element 5, 6, 7. These further cooling elements 5, 6, 7 serve the purpose of passing on the heat loss produced in the respective power semiconductor 2, 3, 4 into the interior space of the housing 1. This interior space is in connection with a respectively assigned inside wall of the housing 1 via one or more cooling elements 8, preferably a cooling element profile. As a result, the heat produced in the interior space of the housing 1, which is of a closed design, is taken up by the cooling element 8, passed on from the latter to the walls of the housing 1, then transferred to the cooling element or elements 9 enclosing the housing and dissipated from these to the surroundings.

The distribution in the interior space of the housing of the lost heat produced in the power semiconductors 2, 3, 4 may be improved by use of a fan 10, which preferably operates in a temperature-controlled manner. If the temperature measured in the interior space of the housing 1 exceeds a predetermined temperature threshold value, the fan 10 is activated and thereby produces an air stream, which transports the heat from the cooling elements 5, 6, 7 to the cooling element 8 provided on the inner sides of the housing. From their, it is dissipated via the housing 1 and the outer cooling element or elements 9 to the surroundings.

The device described above has the effect of providing heat transport which makes it possible for the lost heat produced to be distributed throughout the housing 1. This allows all of the housing surface to be used to dissipate the lost heat. Only certain functional areas of the housing 1, for example fixing areas, cable lead-in areas, etc., remain free from cooling elements or cooling media.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A device, comprising:
   a first lossy electronic component;
   a housing; and
   at least first and second cooling elements,
   wherein the component includes a mounting surface and a further surface, the further surface being arranged at an end of the component opposite to the mounting surface, the housing having walls with inner and outer surfaces, the walls at least defining an interior space of the housing, the component being mounted to the inner surface of one of the walls, by the mounting surface, the first cooling element being placed in contact with the inner surfaces of at least two of the walls or the outer surfaces of at least two of the walls, and the second cooling element being connected to the further surface of the component.

2. The device as claimed in claim 1, wherein the walls are manufactured by aluminium-diecasting.

3. The device as claimed in claim 1, wherein the first cooling element is placed in contact with the outer surfaces, and a number of outer surfaces the first cooling element is placed in contact to is four.

4. The device as claimed in claim 1, wherein the first cooling element is placed in contact with the inner surfaces.

5. The device as claimed in claim 1, wherein the first lossy electronic component is a semiconductor device.

6. The device as claimed in claim 5, wherein the semiconductor device is a power semiconductor.

7. The device as claimed in claim 1, wherein the device further comprises a second lossy electronic component, the second lossy electronic component being mounted to the same inner surface the first lossy electronic component is mounted to.

8. The device as claimed in claim 7, wherein the second lossy electronic component is a semiconductor device.

9. The device as claimed in claim 8, wherein the semiconductor device is a power semiconductor.

10. The device as claimed in claim 1, wherein a fan is provided in the interior space of the housing.

11. The device as claimed in claim 10, wherein the fan is controllable in a temperature-dependent manner.

* * * * *